(12) United States Patent
Tashiro

(10) Patent No.: US 10,249,657 B2
(45) Date of Patent: Apr. 2, 2019

(54) SOLID-STATE IMAGE SENSING DEVICE, DRIVE METHOD, AND ELECTRONIC APPARATUS

(71) Applicant: SONY SEMICONDUCTOR SOLUTIONS CORPORATION, Kanagawa (JP)

(72) Inventor: Yoshiaki Tashiro, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/554,543

(22) PCT Filed: Feb. 26, 2016

(86) PCT No.: PCT/JP2016/055796
§ 371 (c)(1),
(2) Date: Aug. 30, 2017

(87) PCT Pub. No.: WO2016/147837
PCT Pub. Date: Sep. 22, 2016

(65) Prior Publication Data
US 2018/0076243 A1 Mar. 15, 2018

(30) Foreign Application Priority Data
Mar. 13, 2015 (JP) .................. 2015-050257

(51) Int. Cl.
*H01L 27/146* (2006.01)
*H04N 5/378* (2011.01)
(Continued)

(52) U.S. Cl.
CPC ........ *H01L 27/1461* (2013.01); *H01L 27/146* (2013.01); *H01L 27/14621* (2013.01);
(Continued)

(58) Field of Classification Search
CPC ........... H01L 27/14641; H01L 27/1461; H01L 27/14647; H01L 27/146; H04N 5/3696
See application file for complete search history.

(56) References Cited

U.S. PATENT DOCUMENTS

2004/0141073 A1* 7/2004 Yamaguchi ............ H04N 9/045
348/272
2012/0298841 A1* 11/2012 Yamashita ........ H01L 27/14623
250/208.1

FOREIGN PATENT DOCUMENTS

JP 2008-015215 A 1/2008
JP 2008-15215 A 1/2008
(Continued)

OTHER PUBLICATIONS

International Search Report and Written Opinion of PCT Application No. PCT/JP2016/055796, dated May 10, 2016, 02 pages of English Translation and 09 pages of ISRWO.

*Primary Examiner* — Ahmed A Behran
(74) *Attorney, Agent, or Firm* — Chip Law Group

(57) ABSTRACT

The present disclosure relates to a solid-state image sensing device, a drive method, and an electronic apparatus that are configured to suppress the color mixture of a phase difference detection signal to an image sensing signal. The solid-state image sensing device has a pixel area configured to be arranged with a plurality of pixels in which a first photoelectrical conversion section for photoelectrically converting a visible light of a first wavelength range and a second photoelectrical conversion section for photoelectrically converting a visible light of a second wavelength range are formed in different depths as viewed from a cross-sectional direction, and a drive section configured to execute a drive operation of reading each pixel signal having a level corresponding to charges generated in each of the first photoelectrical conversion section and the second photo- (Continued)

electrical conversion section from each of the above-mentioned plurality of pixels. Further, in each of the above-mentioned plurality of pixels, at least one of the first photoelectrical conversion section and the second photoelectrical conversion section is configured as divided when viewed from a planar direction. The present technology is applicable to a solid-state image sensing device capable of detecting an image plane phase difference, for example.

9 Claims, 12 Drawing Sheets

(51) Int. Cl.
    *H04N 5/369*     (2011.01)
    *H01L 29/423*     (2006.01)

(52) U.S. Cl.
    CPC .. *H01L 27/14641* (2013.01); *H01L 27/14647* (2013.01); *H04N 5/3696* (2013.01); *H04N 5/378* (2013.01); *H01L 27/1464* (2013.01); *H01L 27/14614* (2013.01); *H01L 27/14627* (2013.01); *H01L 29/4236* (2013.01)

(56) References Cited

FOREIGN PATENT DOCUMENTS

| | | |
|---|---|---|
| JP | 2008-028105 A | 2/2008 |
| JP | 2013-145292 A | 7/2013 |
| JP | 2014-520397 A | 8/2014 |
| WO | 2013/147198 A1 | 10/2013 |
| WO | 2015/029425 A | 3/2015 |
| WO | 2015/029425 A1 | 3/2015 |

\* cited by examiner

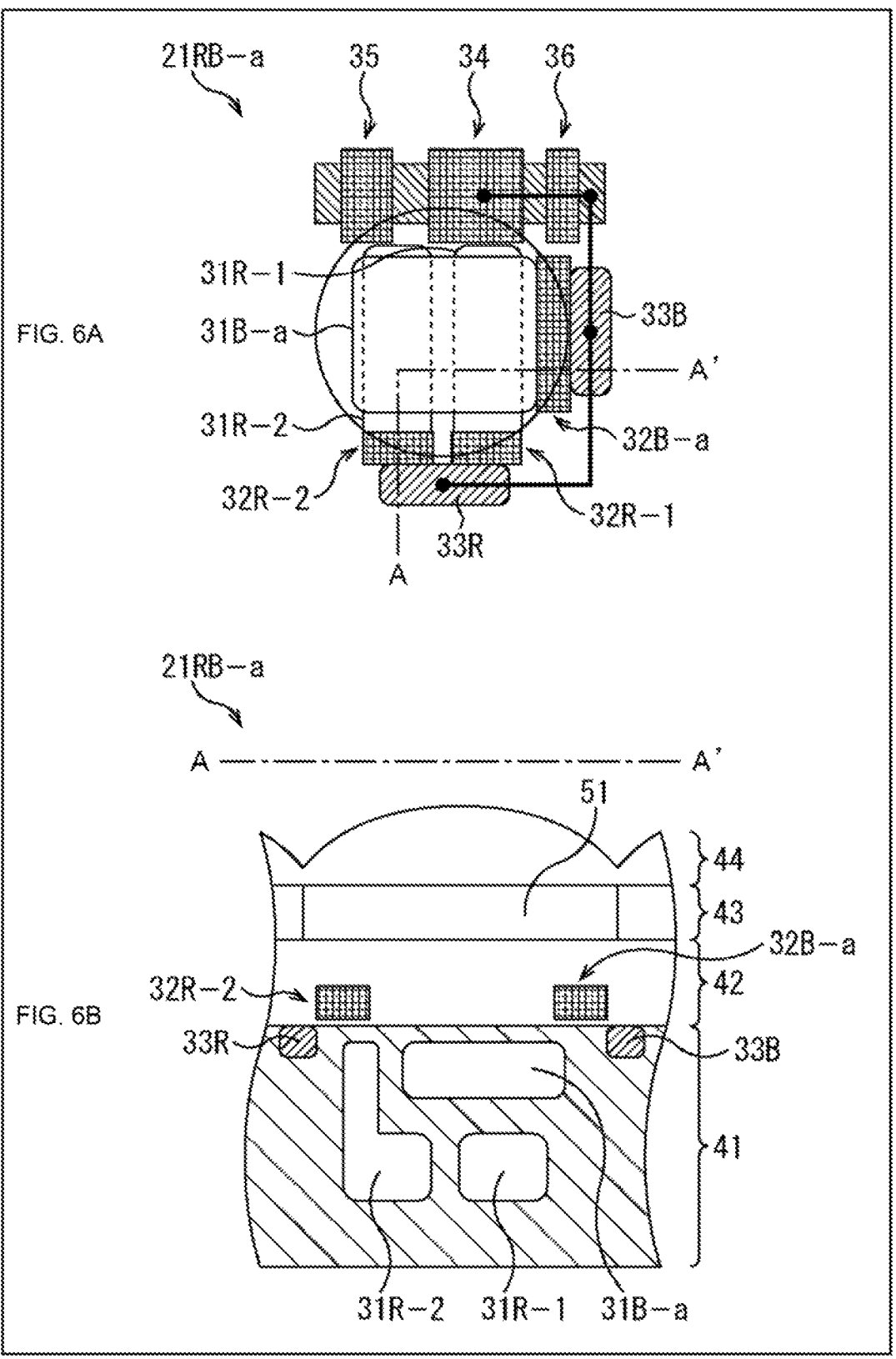

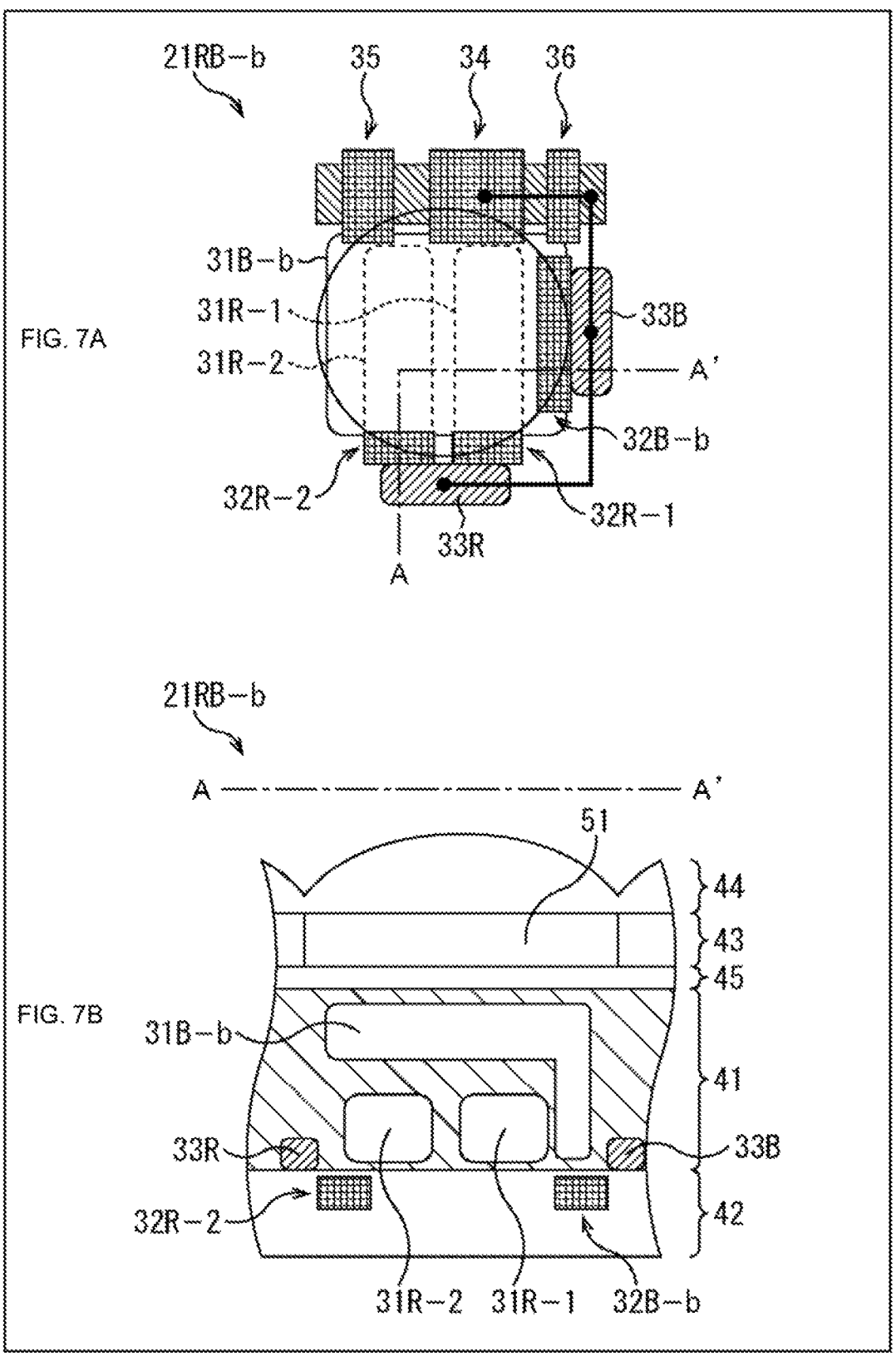

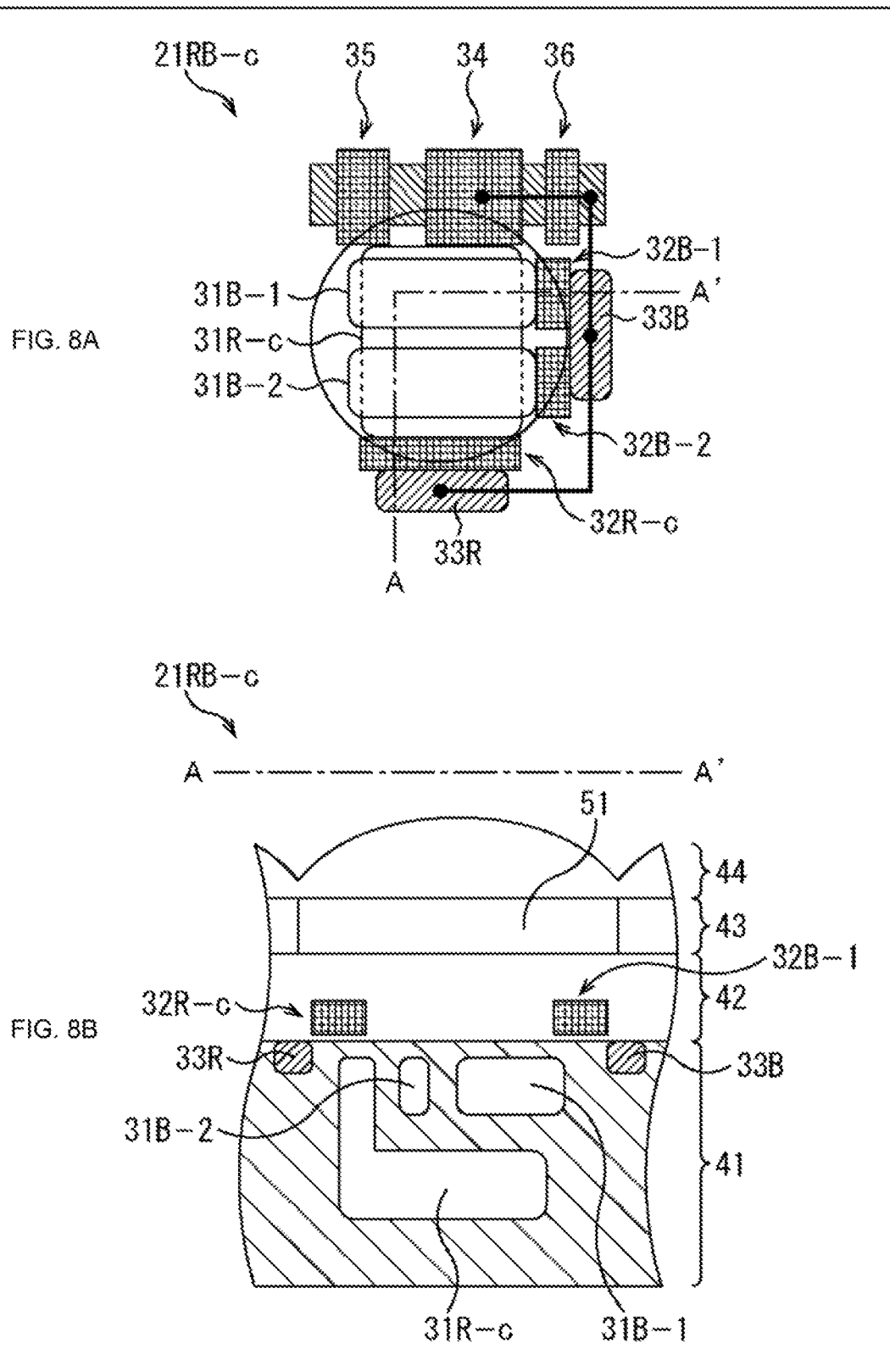

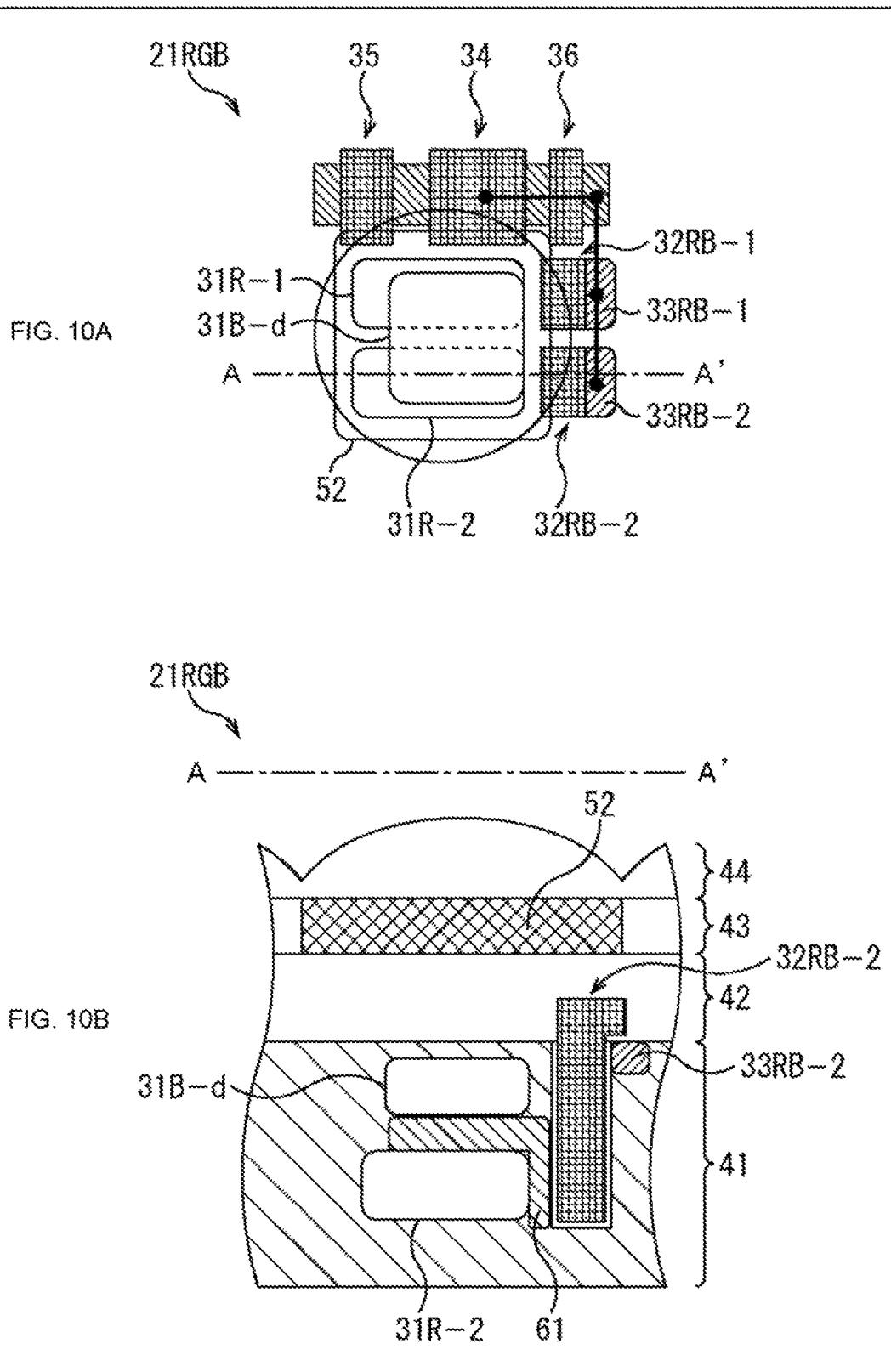

SOLID-STATE IMAGE SENSING DEVICE, DRIVE METHOD, AND ELECTRONIC APPARATUS

CROSS REFERENCE TO RELATED APPLICATIONS

This application is a U.S. National Phase of International Patent Application No. PCT/JP2016/055796 filed on Feb. 26, 2016, which claims priority benefit of Japanese Patent Application No. JP 2015-050257 filed in the Japan Patent Office on Mar. 13, 2015. Each of the above-referenced applications is hereby incorporated herein by reference in its entirety.

TECHNICAL FIELD

The present disclosure relates to a solid-state image sensing device, a drive method, and an electronic apparatus and, more especially, to a solid-state image sensing device, a drive method, and an electronic apparatus that are configured to suppress the color mixture of a signal for phase difference detection into a signal for image sensing.

BACKGROUND ART

In the past, in such electronic apparatuses having image sensing functions as a digital still camera and a digital video camera, a solid-state image sensing device such as a charge coupled device (CCD) image sensor and a complementary metal oxide semiconductor (CMOS) image sensor has been used. The solid-state image sensing device has pixels each being a combination of a photo diode (PD) for photoelectrical conversion and two or more transistors, thereby providing an image on the basis of a pixel signal outputted from two or more pixels arranged on an image plane on which an image of a subject is formed.

Further, recently, a solid-state image sensing device on which phase difference detection pixels capable to detecting a phase difference in an image plane by a configuration in which a PD in one pixel is separated into two are installed has developed. This solid-state image sensing device can be used to independently read, at the time of auto focusing, electric charges generated in the two PDs of a phase difference detection pixel and use these charges as a phase difference detection signal for detecting the phase difference of an incident light, thereby controlling focusing. On the other hand, at the time of image sensing, the above-mentioned solid-state image sensing device can be used to simultaneously read the charges generated in the two PDs of a phase difference detection pixel so as to output a signal as one pixel, thereby providing an image as an image sensing signal.

As described above, the phase difference detecting pixel can output both a phase difference detection signal and an image sensing signal, thereby playing two roles at the same time. Therefore, switching between the roles of the phase difference detection pixel at the time of auto focusing and at the time of image sensing allows the use of not only a part of a solid-state image sensing device but also all the pixels as phase difference detection pixels.

Further, PTL 1 discloses a solid-state image sensing device in which a PD that receives the light in a wavelength range used for image sensing is not divided and a PD formed at a position deeper than the above-mentioned PD is pupil-divided for use in phase difference detection, thereby executing focusing by use of an infrared light that is photoelectrically converted in a domain deep in a semiconductor substrate.

CITATION LIST

Patent Literature

[PTL 1]
JP 2008-28105 A

SUMMARY

Technical Problem

Meanwhile, in the solid-state image sensing device disclosed in PTL 1, since an infrared light is used for phase difference detection, there is a concern about the color mixture of a phase difference detection signal which photoelectrically converts the infrared light into an image sensing signal.

Therefore, the present disclosure addresses the above-mentioned situations and is intended to suppress the color mixture of a phase difference detection signal into an image sensing signal.

Solution to Problem

In carrying out the present disclosure and according to one aspect thereof, there is provided a solid-state image sensing device. The solid-state image sensing device has a pixel area configured to be arranged with a plurality of pixels in which a first photoelectrical conversion section photoelectrically converting a visible light of a first wavelength range and a second photoelectrical conversion section photoelectrically converting a visible light of a second wavelength range are formed in different depths as viewed from a cross-sectional direction and a drive section configured to execute a drive operation of reading each pixel signal having a level corresponding to charges generated in each of the above-mentioned first photoelectrical conversion section and the above-mentioned second photoelectrical conversion section from each of the above-mentioned plurality of pixels. In each of the above-mentioned plurality of pixels, at least one of the above-mentioned first photoelectrical conversion section and the above-mentioned second photoelectrical conversion section is configured as divided when viewed from a planar direction.

In carrying out the present disclosure and according another aspect thereof, there is provided a method of driving a solid-state image sensing device. The above-mentioned solid-state image sensing device has a pixel area configured to be arranged with a plurality of pixels in which a first photoelectrical conversion section photoelectrically converting a visible light of a first wavelength range and a second photoelectrical conversion section photoelectrically converting a visible light of a second wavelength range are formed in different depths as viewed from a cross-sectional direction and a drive section configured to execute a drive operation of reading each pixel signal having a level corresponding to charges generated in each of the above-mentioned first photoelectrical conversion section and the above-mentioned second photoelectrical conversion section from each of the above-mentioned plurality of pixels. In each of the above-mentioned plurality of pixels, at least one of the above-mentioned first photoelectrical conversion section and the above-mentioned second photoelectrical conversion section is configured as divided when viewed from a planar direction. In the above-mentioned plurality of pixels, a conversion section converting a charge obtained by photoelectrical conversion by the above-mentioned first photoelectrical conversion section into a first pixel signal and a conversion section converting a charge obtained by photoelectrical conversion by the above-mentioned second photoelectrical conversion section into a second pixel signal are used in a shared manner and the above-mentioned drive section executes a drive operation of simultaneously reading the above-mentioned first pixel signal and the above-mentioned second pixel signal from one of the above-mentioned plurality of pixels.

In carrying out the present disclosure and according to still another aspect thereof, there is provided an electronic apparatus having a solid-state image sensing device. The above-mentioned solid-state image sensing device has a pixel area configured to be arranged with a plurality of pixels in which a first photoelectrical conversion section photoelectrically converting a visible light of a first wavelength range and a second photoelectrical conversion section photoelectrically converting a visible light of a second wavelength range are formed in different depths as viewed from a cross-sectional direction and a drive section configured to execute a drive operation of reading each pixel signal having a level corresponding to charges generated in each of the above-mentioned first photoelectrical conversion section and the above-mentioned second photoelectrical conversion section from each of the above-mentioned plurality of pixels. In each of the above-mentioned plurality of pixels, at least one of the above-mentioned first photoelectrical conversion section and the above-mentioned second photoelectrical conversion section is configured as divided when viewed from a planar direction.

In one aspect of the present disclosure, a pixel area configured to be arranged with a plurality of pixels in which a first photoelectrical conversion section photoelectrically converting a visible light of a first wavelength range and a second photoelectrical conversion section photoelectrically converting a visible light of a second wavelength range are formed in different depths as viewed from a cross-sectional direction and a drive section configured to execute a drive operation of reading each pixel signal having a level corresponding to charges generated in each of the above-mentioned first photoelectrical conversion section and the above-mentioned second photoelectrical conversion section from each of the above-mentioned plurality of pixels are arranged. Then, in the pixel, at least one of the first photoelectrical conversion section and the second photoelectrical conversion section is configured as divided when viewed from a planar direction.

Advantageous Effect of Invention

According to one aspect of the present disclosure, the color mixture of a phase difference detection signal into an image sensing signal can be suppressed.

BRIEF DESCRIPTION OF DRAWINGS

FIGS. 6A and 6B depict diagrams illustrating a second configurational example of a pixel capable of outputting red and blue pixel signals.

FIGS. 7A and 7B depict diagrams illustrating a third configurational example of a pixel capable of outputting read and blue pixel signals.

FIGS. 8A and 8B depict diagrams illustrating a fourth configurational example of a pixel capable of outputting read and blue pixel signals.

FIGS. 10A and 10B depict diagrams illustrating a configurational example of a pixel capable of outputting red, green, and blue pixel signals.

DESCRIPTION OF EMBODIMENTS

The following describes in detail specific embodiments to which the present technology is applied with reference to drawings.

Figure 1:
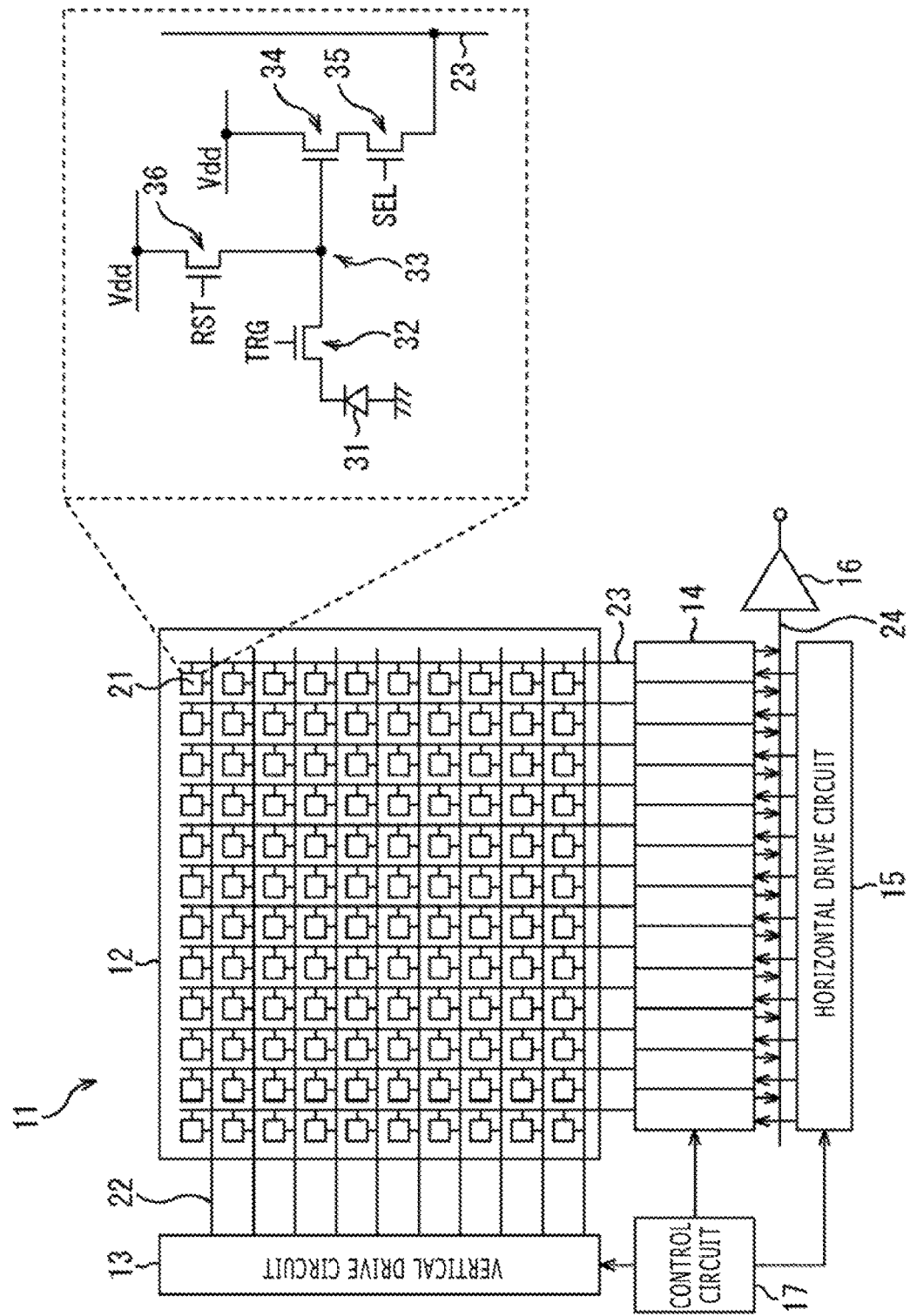
FIG. 1 is a block diagram illustrating a configurational example of one embodiment of an image sensing device to which the present technology is applied.

Now, referring to FIG. 1, there is depicted a block diagram illustrating a configurational example of one embodiment of an image sensing device to which the present technology is applied.

As depicted in FIG. 1, an image sensing device 11 is configured by a pixel area 12, a vertical drive circuit 13, a column signal processing circuit 14, a horizontal drive circuit 15, an output circuit 16, and a control circuit 17.

The pixel area 12 is a photosensitive surface for receiving light condensed by an optical system not depicted. On the pixel area 12, two or more pixels 21 are arranged in a matrix manner, each of the pixels 21 being connected to the vertical drive circuit 13, line by line, through a horizontal signal line 22 and to the column signal processing circuit 14, column by column, through a vertical signal line 23. The two or more pixels 21 output pixel signals having levels corresponding to the volumes of received light, from which pixel signals an image of a subject imaged in the pixel area 12 is formed.

The vertical drive circuit 13 supplies drive signals for driving (transferring, selecting, or resetting, for example) each pixel 21 to the pixel 21 through the horizontal signal line 22 sequentially for each line of the two or more pixels 21 arranged in the pixel area 12. The column signal processing circuit 14 executes correlated double sampling (CDS) processing on the pixel signals outputted from the two or more pixels 21 through the vertical signal line 23 so as to execute analog to digital (AD) conversion of the pixel signals and, at the same time, remove a reset noise.

The horizontal drive circuit 15 supplies, to the column signal processing circuit 14, drive signals for outputting pixel signals from the column signal processing circuit 14 to the a data output signal line 24 sequentially for each column of two or more pixels 21 arranged in the pixel area 12. With a timing in accordance with a drive signal of the horizontal drive circuit 15, the output circuit 16 amplifies the pixel signals supplied from the column signal processing circuit 14 through the data output signal line 24 and outputs the amplified pixel signals to a signal processing circuit in a following step. The control circuit 17 controls the driving of each block inside the image sensing device 11. For example, the control circuit 17 generates a clock signal in accordance with the drive interval of each block and supplies the generated clock signal to each block.

Further, the pixel 21 is configured by a PD 31, a transfer transistor 32, a floating diffusion (FD) section 33, an amplification transistor 34, a selection transistor 35, and a reset transistor 36.

The PD 31 is a photoelectrical conversion section for converting incident light into electric charges by photoelectrical conversion and stores the resultant charges, the anode terminal thereof being ground and the cathode terminal thereof being connected to the transfer transistor 32. The transfer transistor 32 is driven in accordance with a transfer signal TRG supplied from the vertical drive circuit 13 so as to transfer the charges stored in the PD 31 to the FD section 33 when the transfer transistor 32 is turned on. The FD section 33 is a floating diffusion area having a predetermined storage capacity connected to a gate electrode of the amplification transistor 34 and stores the charges transferred from the PD 31.

The amplification transistor 34 outputs a pixel signal of having level (namely, a potential of the FD section 33) corresponding to the charges stored in the FD section 33 to the vertical signal line 23 through the selection transistor 35. That is, the configuration in which the FD section 33 is connected to the gate electrode of the amplification transistor 34 makes the FD section 33 and the amplification transistor 34 function as a conversion section in which a charge generated at the PD 31 is converted into a pixel signal having a level corresponding to that charge.

The selection transistor 35 is driven in accordance with a selection signal SEL supplied from the vertical drive circuit 13 and, when the selection transistor 35 is turned on, makes a pixel signal outputted from the amplification transistor 34 be ready to be outputted to the vertical signal line 23. The reset transistor 36 is driven in accordance with a reset signal RST supplied from the vertical drive circuit 13 and, when the reset transistor 36 is turned on, makes the charge stored in the FD section 33 be drained to a drain power supply Vdd so as to reset the FD section 33.

In the image sensing device 11 configured as described above, the PDs 31 of one pixel 21 are arranged by dividing into two as viewed from the planar direction allows that pixel 21 to be used as a phase difference detection pixel for detecting a phase difference on an image plane on which an image of a subject is formed.

Further, the image sensing device 11 is configured by laminating, on the photosensitive surface side of the pixel area 12, filter layers on which color filters for transmitting the lights of colors received by the pixel 21 are arranged in a planar manner for each pixel 21. Therefore, from the pixel 21 on which a color filter for transmitting red light is arranged, a red pixel signal (hereafter referred to as an R signal as required) is outputted. Likewise, from the pixel 21 on which a color filter for transmitting green light is arranged, a green pixel signal (hereafter referred to as a G signal as required) is outputted. From the pixel 21 on which a color filter for transmitting blue light is arranged, a blue pixel signal (hereafter referred to as a B signal as required) is outputted.

In addition, the image sensing device 11 can output pixel signals of two or more colors from one pixel 21 by arranging two or more PDs 31 in different depths as viewed from the cross-sectional direction so as to splits up incident light into two or more colors in one pixel 21. For example, in the pixel 21 on which a color filter of magenta that transmits red and blue lights is arranged, arranging a PD 31 for receiving red light and a PD 31 for receiving blue light at different depths as viewed from the cross-sectional direction allows the outputting of an R signal and a B signal.

Figure 2:
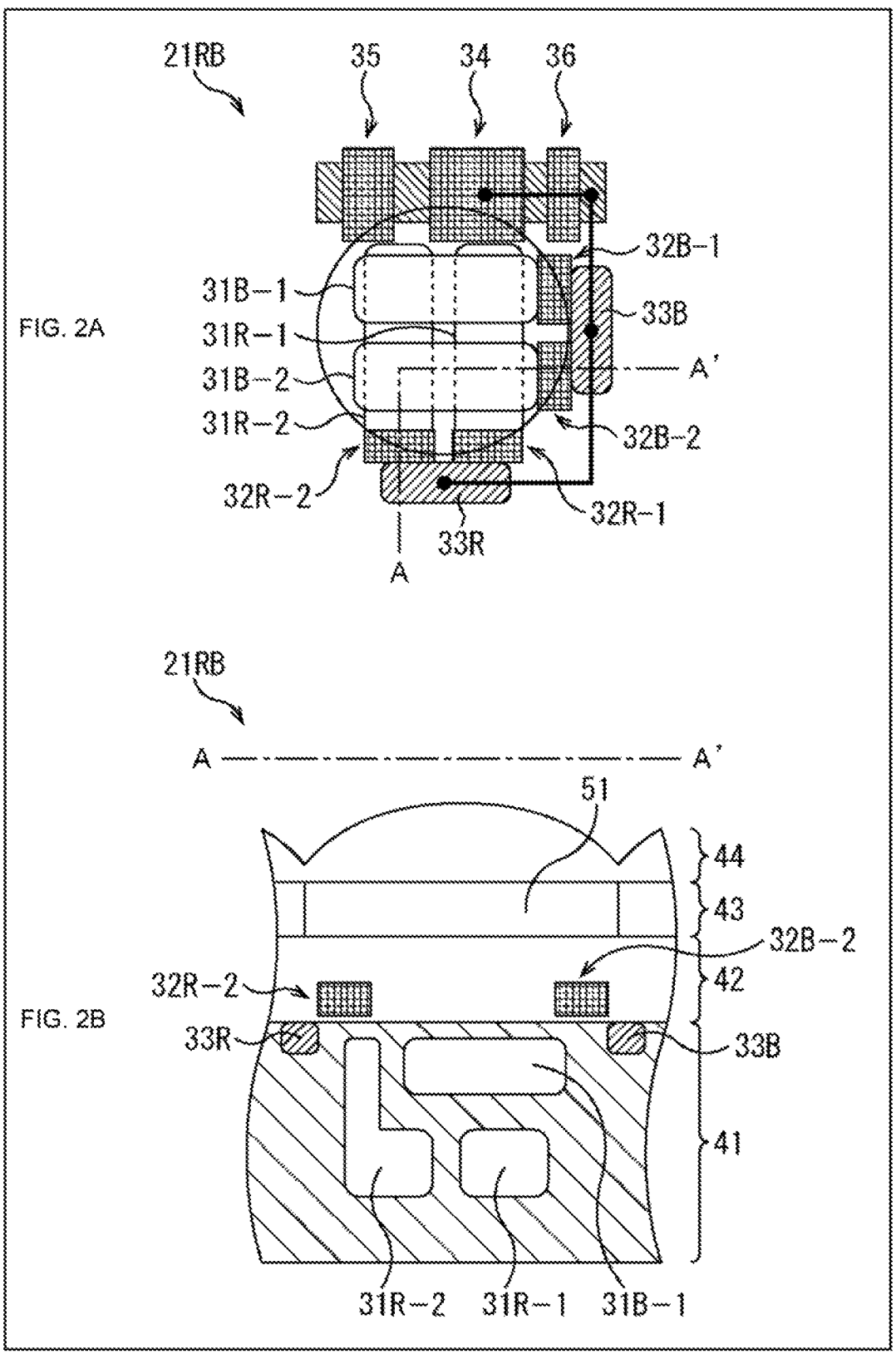
FIGS. 2A and 2B depict diagrams illustrating a first configurational example of a pixel capable of outputting red and blue pixel signals.

The following describes a first configurational example of a pixel 21RB that can output an R signal and a B signal with reference to FIGS. 2A and 2B. FIG. 2A illustrates a planar configurational example of the pixel 21RB, while FIG. 2B illustrates a cross-sectional configurational example of the pixel 21RB cut along a dot-and-dash line A-A' depicted in FIG. 2A.

As depicted in FIG. 2A, the pixel 21RB has a PD 31R-1 and a PD 31R-2 for photoelectrically converting red light and a PD 31B-1 and a PD 31B-2 for photoelectrically converting blue light.

Further, as depicted in FIG. 2B, the pixel 21RB is configured by a lamination of a semiconductor substrate 41, a wiring layer 42, a filter layer 43, and an on-chip lens layer 44, the filter layer 43 being arranged with a color filter 51 of magenta color that transmits red light and blue light. In the pixel 21RB, the PD 31R-1 and the PD 31R-2 are formed in a deep domain of the semiconductor substrate 41 as viewed from the light incident side and the PD 31B-1 and the PD 31B-2 are formed in a shallow domain of the semiconductor substrate 41 as viewed from the light incident side. Thus, the pixel 21RB uses a structure (hereafter referred to as a vertical light split structure as required) that splits up light into red and blue in the depth direction of the semiconductor substrate 41.

To be more specific, an incident light into the pixel 21RB is condensed by the on-chip lens layer 44 to be cut in green wavelength by the magenta color filter 51 of the filter layer 43, the resultant light being radiated to the semiconductor substrate 41. Next, in the shallow domain of the semiconductor substrate 41, the blue light having short wavelength is photoelectrically converted by the PD 31B-1 and the PD 31B-2 and, in the deep domain of the semiconductor substrate 41, the red light having long wavelength is photoelectrically converted by the PD 31R-1 and the PD 31R-2.

Further, as depicted in FIG. 2A, in the pixel 21RB, the PD 31R-1 and the PD 31R-2 are arranged as divided into left and right side of the diagram and the PD 31B-1 and the PD 31B-2 are arranged as divided into the upper and lower of the diagram. That is, in the pixel 21RB, the PD 31R-1 and the PD 31R-2 and the PD 31B-1 and the PD 31B-2 are divided into the directions approximately orthogonal (different) to each other as viewed in a planar manner.

Therefore, the pixel 21RB can detect the phase difference in the directions approximately orthogonal to each other by the PD 31R-1 and the PD 31R-2 and the PD 31B-1 and the PD 31B-2. For example, the R signals read independently from the PD 31R-1 and the PD 31R-2 are used for the detection of the phase difference between the left and right directions of an image, while the B signals read independently from the PD 31B-1 and the PD 31B-2 are used for the detection of the phase difference between the up and down directions of an image.

It should be noted that, if the pixel 21RB is used as an image sensing pixel, R signals are read simultaneously from the PD 31R-1 and the PD 31R-2 and B signals are read simultaneously from the PD 31B-1 and the PD 31B-2.

The pixel 21RB configured as described above photoelectrically converts the light of wavelength range of red and blue visible lights so as to provide a phase difference detection signal, so that, as with the solid-state image sensing device disclosed in PTL 1 for example, the occurrence of color mixture can be suppressed as compared with the configuration in which an infrared light is used for phase difference detection. Further, by forming the PD 31R-1 and the PD 31R-2 and the PD 31B-1 and the PD 31B-2 at different depths for the red and blue colors that are separated from each other in wavelength range among visible lights, the pixel 21RB can minimize the possibility of the occurrence of color mixture.

Further, in the past, the phase difference in one direction has been able to be detected by one pixel. However, with the pixel 21RB, the phase differences in two directions can be detected. To be more specific, in the past, the detection of the phase differences in two directions has been needed to arrange a phase difference detection pixel for detecting the phase difference in left and right direction and a phase difference detection pixel for detection phase difference in the up and down directions at physically different locations. For this reason, an offset occurs in the location where a phase difference is detected. By contrast, the pixel 21RB can detect the phase differences in the left and right directions and the up and down directions physically at one location, thereby avoiding the occurrence of a positional offset as described above.

In addition, with a CMOS image sensor driven by a rolling shutter method, a positional offset becomes a sampling time offset, so that there occurs a concern about the focusing accuracy on a subject. On the other hand, with the pixel 21RB, no positional offset occurs, so that no sampling time offset occurs. Therefore, the image sensing device 11 using the pixel 21RB can enhance the focusing accuracy on a subject.

Further, a structure in which the purposes of use are selected for phase difference detection and image sensing as with the solid-state image sensing device disclosed in PTL 1, a pixel at certain location can detect only the phase difference in one direction, so that the offsets in sampling position and time cannot be cancelled. By contrast, with the pixel 21RB, the signals for phase difference detection and image sensing can be obtained by use of visible light and therefore both the functions of phase difference detection pixel and image sensing pixel can be provided by one pixel.

It should be noted that the pixel 21RB has a configuration in which a PD 31 for red light detection and a PD 31 for blue light detection are used. However, it is also practicable to use a configuration in which a red light detecting PD 31 and a green light detecting PD 31 are used or a configuration in which a green light detecting PD 31 and a blue light detecting PD 31 are used, for example.

Figure 3:
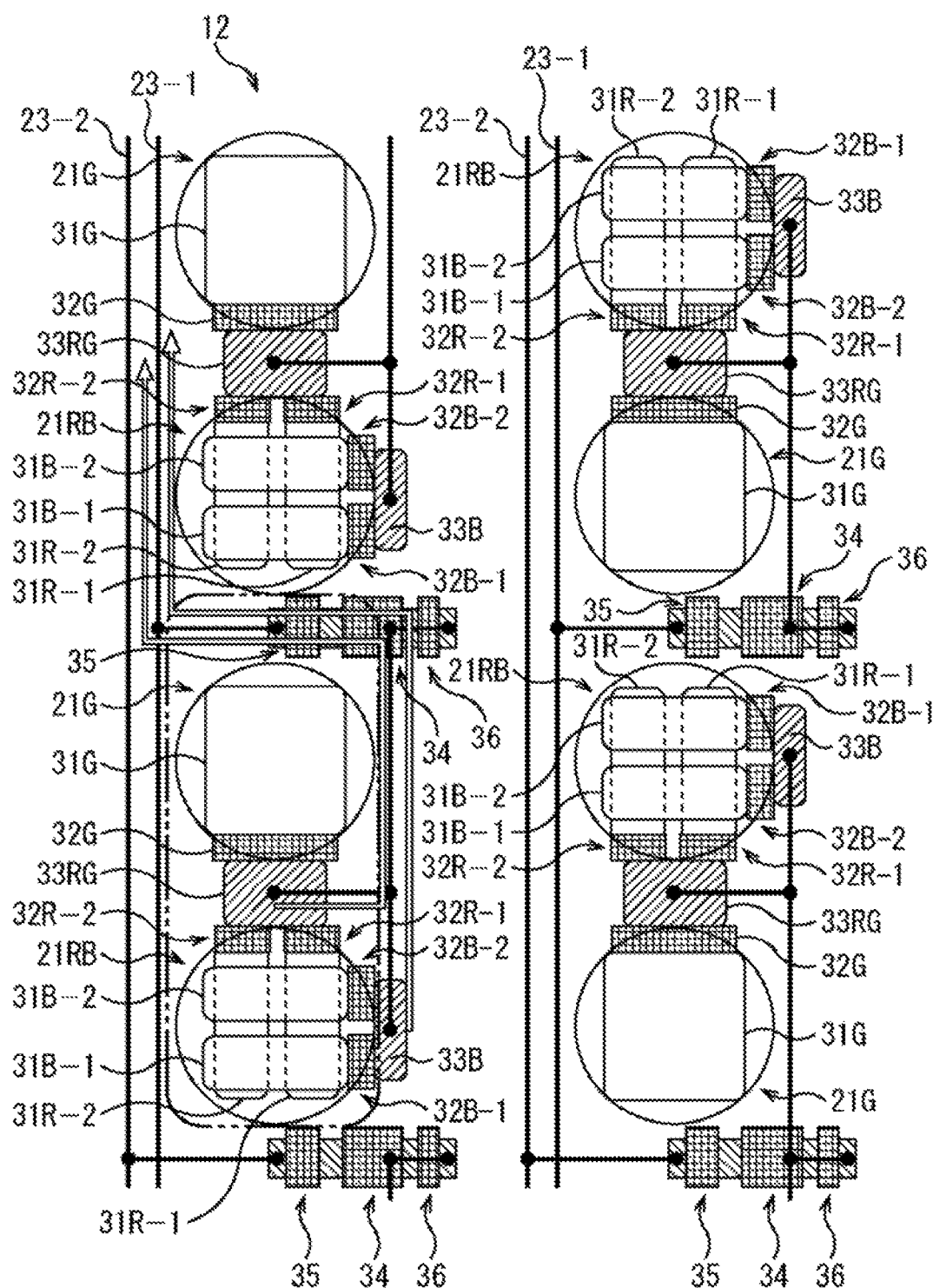
FIG. 3 is a diagram illustrating a first layout example of a pixel area.

Next, FIG. 3 is a diagram illustrating an example of a first layout of the pixel area 12.

As depicted in FIG. 3, the pixel area 12 is arranged with the pixel 21RB capable to outputting an R signal and a B signal and a pixel 21G capable of outputting a G signal alternately in the horizontal direction and the vertical direction. Further, an R signal and a B signal outputted from the pixel 21RB enclosed by two-dot dash lines and the G signal outputted from the pixel 21G are used as a set of pixel signals (an RGB signal) with the pixel 21RB and the pixel 21G being sub pixels, for example.

The pixel 21G has a PD 31G for green light photoelectrical conversion and a transfer transistor 32G for transferring the charge of the PD 31G. As depicted in the diagram, a PD 31R-1 and a PD 31R-2 of the pixel 21RB and the PD 31G of the pixel 21G use one FD section 33RG in a shared manner. To be more specific, the PD 31R-1 and the PD 31R-2 of the pixel 21RB are connected to the FD section 33RG through the transfer transistors 32R-1 and 32R-2, respectively, and the PD 31G of the pixel 21G is connected to the FD section 33RG through the transfer transistor 32G. Further, the pixel area 12 has a wiring structure in which the amplification transistor 34 for R signal conversion and the amplification transistor 34 for B signal conversion are used in a shared manner in one pixel 21RB.

Still further, in the pixel area 12, two vertical signal lines 23-1 and 23-2 are arranged for one column of the pixel 21 RB and the pixel 21G lined up in the vertical direction. Further, the pixel area 12 has a wiring structure in which the pixel 21RB and the pixel 21G that output the pixel signals (an RGB signal) that are used as one set are connected to the vertical signal lines 23-1 and 23-2, respectively, alternately in the vertical direction. The setup allows the image sensing device 11 to read two sets of pixel signals in parallel through the vertical signal lines 23-1 and 23-2.

With the wiring structure of the pixel area 12 as described above, the pixel signals of the same color can be simultaneously read from two or more pixel 21RB and pixel 21G individually. If the simultaneity for each color is prioritized, the wiring structure as described is employed.

It should be noted that, in FIG. 3, a route for reading an R signal from the pixel 21RB to the vertical signal line 23-1 and a route for reading a B signal from the pixel 21RB to the vertical signal line 23-1 are indicated by white arrows for the pixel 21RB and the pixel 21G enclosed by two-dot lines. As depicted in the diagram, since the pixel area 12 has a wiring structure in which the FD section 33RG and the FD section 33B are connected to the gate electrode of the common amplification transistor 34, both an R signal and a B signal are read to the vertical signal line 23-1 through the common amplification transistor 34. To be more specific, in the pixel 21RB, the PD 31R-1, the PD 31R-2, the PD 31B-1, and the PD 31B-2 use the amplification transistor 34 in a shared manner. For this reason, in the wiring structure of the pixel area 12, an R signal and a B signal cannot be read at the same time, so that a drive operation is executed such that an R signal and a B signal are sequentially read.

Therefore, if the simultaneous reading of an R signal and a B signal from the pixel 21RB is prioritized, a wiring structure in which an R signal and a B signal are read from one pixel 21RB through different amplification transistors 34.

Figure 4:
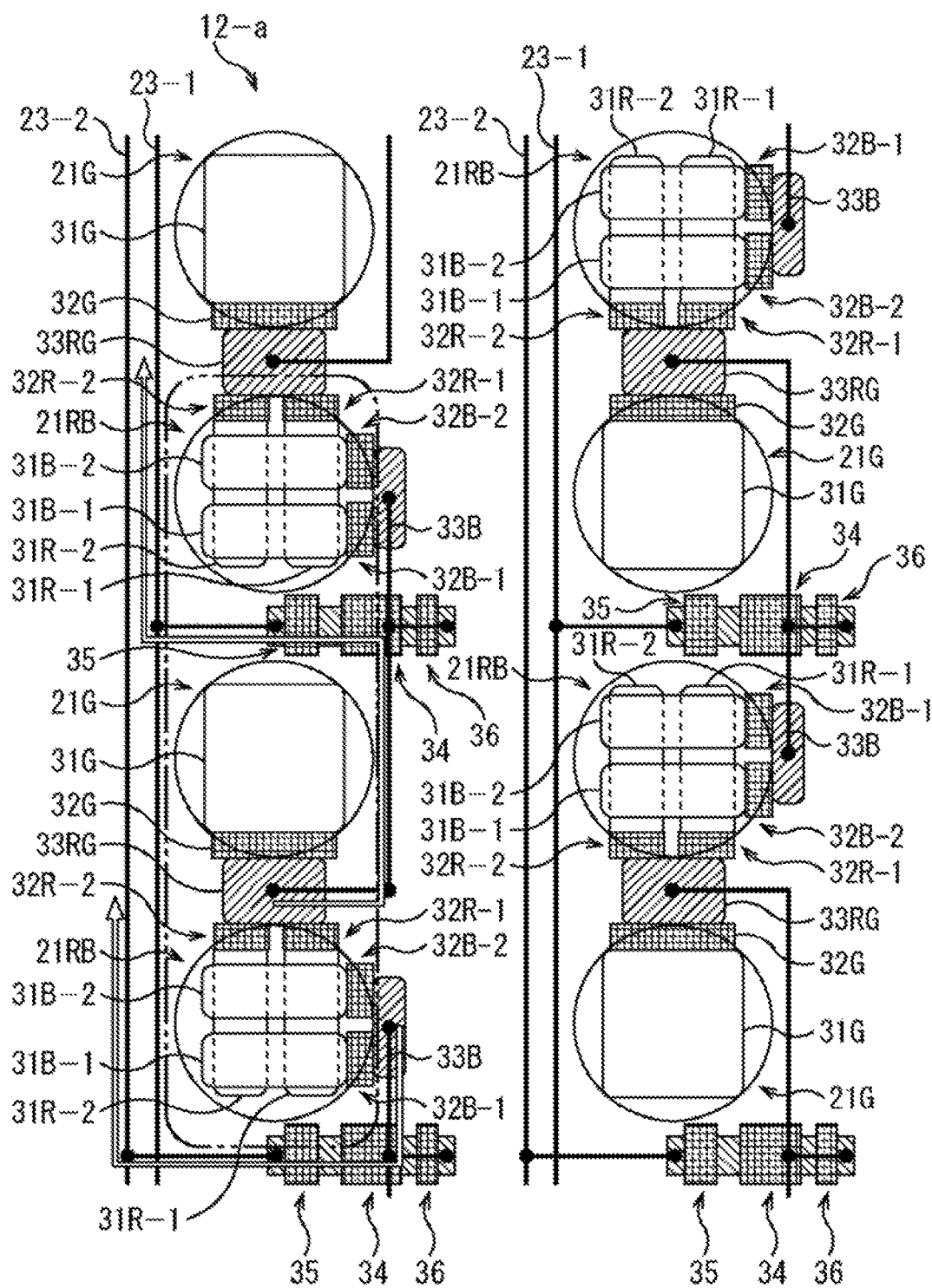
FIG. 4 is a diagram illustrating a second layout example of a pixel area.

Referring to FIG. 4, there is depicted a diagram illustrating an example of a second layout of the pixel area 12.

In a pixel area 12-a depicted in FIG. 4, the pixel 21RB capable of outputting an R signal and a B signal and the pixel 21G capable of outputting a G signal are arranged alternately in the horizontal direction and the vertical direction, as with the pixel area 12 depicted in FIG. 3. However, in the pixel area 12-a, a wiring structure for reading pixel signals from the pixel 21RB and the pixel 21G to the vertical signal lines 23-1 and 23-2, respectively, is different from that of the pixel area 12 depicted in FIG. 3.

For example, the pixel area 12-a has a wiring structure in which the two pixels 21RB and the pixel 21G enclosed by two-dot dash lines output an R signal, a G signal, and a B signal that are used as one set of pixel signal. As depicted in the diagram, the amplification transistor 34 used by the two pixels 21RB and one pixel 21G enclosed by two-dot dash lines in a shared manner is connected with an FD section 33B of the pixel 21RB above the amplification transistor 34 and a FD section 33RG below the amplification transistor 34.

Therefore, to the vertical signal line 23-1 to which this amplification transistor 34 is connected through the selection transistor 35, the B signal outputted from the upper pixel 21RB, the G signal outputted from the pixel 21G, and the R signal outputted from the lower pixel 21RB are outputted as one set of pixel signals (an RGB signal).

Further, in the wiring structure of the pixel area 12-a, if attention is directed to one pixel 21RB in the lower left side, an R signal and a B signal outputted from this pixel 21RB are read through different routes individually. To be more specific, as indicated by white arrows, an R signal outputted from the pixel 21RB is outputted to the vertical signal line 23-1 through the amplification transistor 34 above the pixel 21RB and a B signal outputted from the pixel 21RB is outputted to the vertical signal line 23-2 through the amplification transistor 34 below the pixel 21RB.

As described above, in the pixel area 12-a, the amplification transistor 34 for converting the charge obtained by photoelectrically converting a red light in the pixel 21RB into an R signal is used the pixel 21G and the pixel 21RB arranged over the pixel 21RB in a shared manner. Further, in the pixel area 12-a, the amplification transistor 34 for converting the charge obtained by photoelectrically converting a blue light in the pixel 21RB into a B signal is used by the pixel 21G and the pixel 21RB, not depicted, arranged below the pixel 21RB in a shared manner.

To be more specific, the pixel area 12-a has a wiring structure in which, in two (two or more) pixels 21RB, the amplification transistor 34 for converting an R signal outputted from one pixel 21RB and the amplification transistor 34 for converting a B signal outputted from the other pixel 21RB are used in a shared manner. Thus, use of a wiring structure capable of reading an R signal and a B signal through different routes allows the pixel area 12-a to simultaneously read an R signal and a B signal from one pixel 21RB. That is, the vertical drive circuit 13 depicted in FIG. 1 executes a drive operation for simultaneously reading (with the same timing) an R signal and a B signal from one pixel 21RB.

Therefore, in the pixel area 12-a, simultaneously reading an R signal and a B signal from one pixel 21RB more enhances the focusing accuracy on a moving subject than in the pixel area 12 depicted in FIG. 3, for example.

Figure 5:
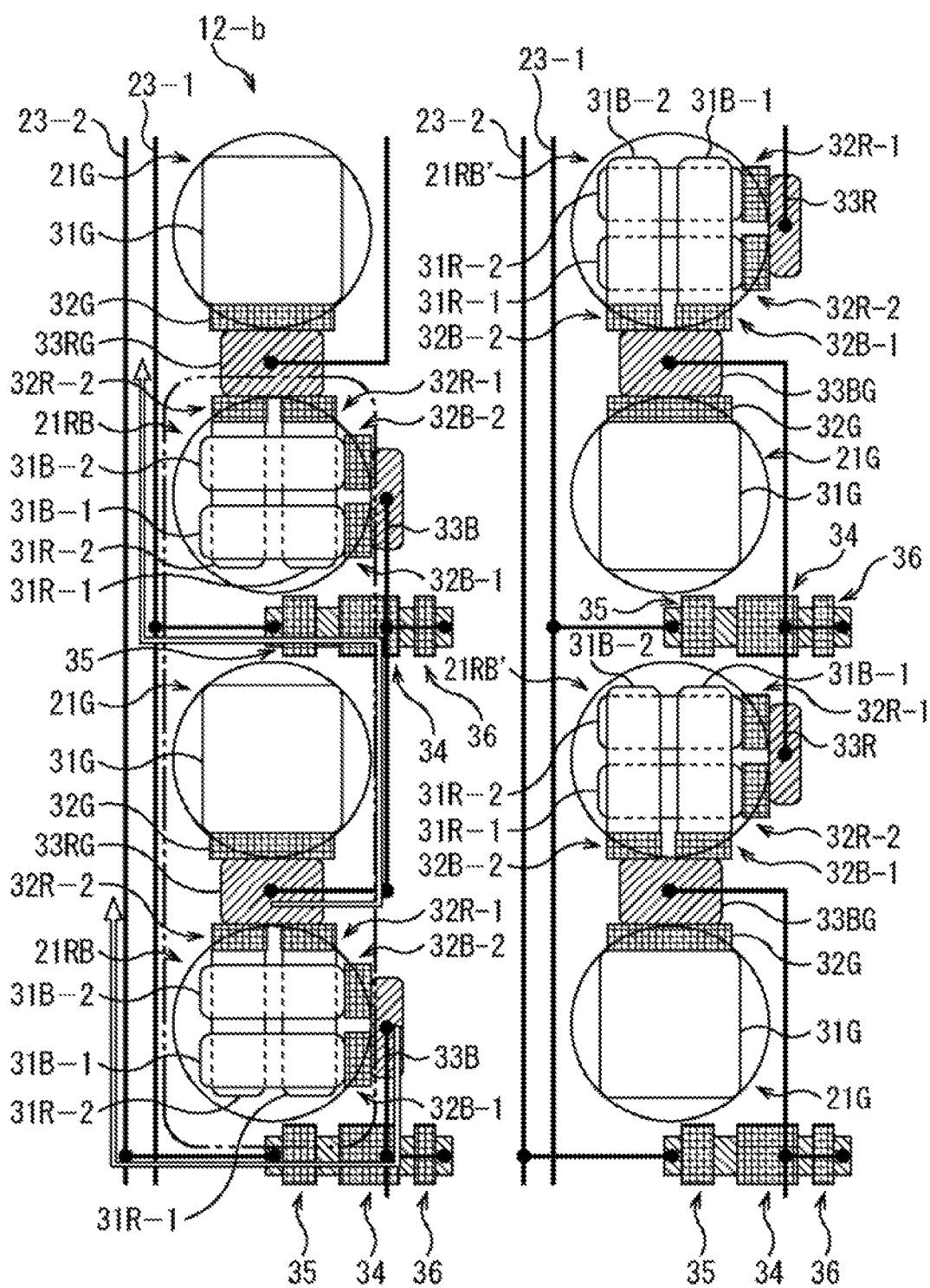
FIG. 5 is a diagram illustrating a third layout example of a pixel area.

Now, referring to FIG. 5, there is depicted an example of a third layout of the pixel area 12.

A pixel area 12-b depicted in FIG. 5 has a wiring structure in which two pixels 21RB and one pixel 21G enclosed by two-dot dash lines output one set of pixel signals (an RGB signal) as with the pixel area 12-a depicted in FIG. 4. Further, in the wiring structure of the pixel area 12-b, an R signal and a B signal can be read from one pixel 21RB at the same time as with the pixel area 12-a depicted in FIG. 4.

Then, in the pixel area 12-b, the structure of the pixel 21RB differs from column to column in the vertical direction. To be more specific, in the pixel 21RB arranged in the left column (an odd-number column for example) depicted in FIG. 5, the PD 31R-1 and the PD 31R-2 are divided into the left and right sides in the diagram and the PD 31B-1 and the PD 31B-2 are divided into the upper and lower sides in the diagram as with the pixel 21RB depicted in FIGS. 2A and 2B. By contrast, in a pixel 21RB' arranged in the right column (an even-number column for example) depicted in FIG. 5, the PD 31R-1 and the PD 31R-2 are divided into the upper and lower sides in the diagram and the PD 31R-1 and the PD 31B-2 are divided into left and right sides in the diagram unlike the pixel 21RB depicted in FIGS. 2A and 2B.

To be more specific, an R signal of the pixel 21RB is used for the phase difference detection in the left and right directions and a B signal of the pixel 21RB is used for the phase difference detection in the up and down directions. By contrast, an R signal of the pixel 21RB' is used for the phase difference detection in the up and down directions and a B signal of the pixel 21RB' is used for the phase difference detection in the left and right directions.

As described above, in the pixel area 12-b, the phase differences in the left and right directions and up and down directions for each color by the structure in which the pixel 21RB and the pixel 21RB' are alternately arranged for each column, thereby enhancing the accuracy of focusing.

The following describes an example of a second configuration of the pixel 21RB with reference to FIGS. 6A and 6B. FIG. 6A depicts an example of a planar configuration of the pixel 21RB-a and FIG. 6B depicts an example of a cross-sectional configuration of the pixel 21RB-a along a one-dot dash line A-A' depicted in FIG. 6A.

With the pixel 21RB-a depicted in FIGS. 6A and 6B, the configurations similar to those of the pixel 21RB depicted in FIGS. 2A and 2B are denoted by the same signs and the detail description thereof will be skipped. To be more specific, the pixel 21RB-a is similar in configuration to the pixel 21RB depicted in FIGS. 2A and 2B in that the PD 31R-1 and the PD 31R-2 are arranged as divided into the left and right sides in the diagram.

It should be noted, however, that the pixel 21RB-a is different in configuration from the pixel 21RB depicted in FIGS. 2A and 2B in that one PD 31B-a is arranged. To be more specific, while, in the pixel 21RB depicted in FIGS. 2A and 2B, the PD 31B-1 and the PD 31B-2 for photoelectrically converting blue light are arranged as divided, while one PD 31B-a is arranged as undivided in the pixel 21RB-a.

To be more specific, while an R signal is used for phase difference detection in the pixel 21RB-a, a B signal is not used for phase difference detection but is used for image construction. Thus, the pixel 21RB-a may be configured such that at least one of an R signal and a B signal is used for phase difference detection rather than used for the phase difference detection in two directions.

In addition, the pixel 21RB-a is constructed in surface radiation type in which light is radiated onto the surface on which the wiring layer 42 is laminated relative to the semiconductor substrate 41. That is, the pixel 21RB-a has a configuration in which the charges from the PD 31B-a formed on the shallow domain of the semiconductor substrate 41 can be read with ease.

The following describes an example of a third configuration of the pixel 21RB with reference to FIGS. 7A and 7B. FIG. 7A depicts an example of a planar configuration of a pixel 21RB-b and FIG. 7B depicts an example of a cross-sectional configuration of the pixel 21RB-b along a one-dot dash line A-A' depicted in FIG. 7A.

With the pixel 21RB-b depicted in FIGS. 7A and 7B, the configurations similar in configuration to those of the pixel 21RB-a depicted in FIGS. 6A and 6B are denoted by the same signs and the detail description thereof will be skipped. To be more specific, the pixel 21RB-b is similar to the pixel 21RB-a depicted in FIGS. 6A and 6B in the configuration that the PD 31R-1 and the PD 31R-2 are arranged as divided into the left and right sides and a PD 31B-b being arranged as undivided in the diagram.

It should be noted, however, that the pixel 21RB-b is different in configuration from the pixel 21RB-a depicted in FIGS. 6A and 6B in that the pixel 21RB-b has a structure of rear surface radiation type in which light is radiated onto the rear surface directed to the opposite side relative to the surface on which the wiring layer 42 is laminated relative to the semiconductor substrate 41. With such a structure of rear surface radiation type, the filter layer 43 and the on-chip lens layer 44 are laminated on the rear surface side of the semiconductor substrate 41 via an insulation layer 45. As compared with the structure of surface radiation type, the rear surface radiation type can increase the volume of light that is radiated onto the semiconductor substrate 41.

The pixel 21RB-b configured as described above can widen the area of the PD 31B-b more than the PD 31B-a of the pixel 21RB-a depicted in FIGS. 6A and 6B, thereby increasing the volume of light to be received by the PD 31B-b. Further, the pixel 21RB-b can make thinner the semiconductor substrate 41 but cannot allocate an area for photoelectrically converting infrared light in the semiconductor substrate 41. Therefore, it was difficult to apply the configuration using infrared light for phase difference detection as with disclosed in PTL 1 as described above to the structure of rear surface radiation type, for example. By contrast, the pixel 21RB-b uses visible light for phase difference detection, so that the above-mentioned difficulty can be excluded.

Further, the pixel 21RB-b is configured such that the charges from the PD 31R-1 and the PD 31R-2 formed in the deep domain of the semiconductor substrate 41 are easily read. For example, since the PD 31R-1 and the PD 31R-2 for use in phase difference detection are low in charge transfer characteristic, use of the configuration for each charge reading allows the transfer of charges more surely.

The following describes an example of a fourth configuration of the pixel 21RB with reference to FIGS. 8A and 8B. FIG. 8A depicts an example of a planar configuration of a pixel 21RB-c and FIG. 8B depicts an example of a cross-sectional configuration of the pixel 21RB-c along a one-dot dash line A-A' depicted in FIG. 8A.

With the pixel 21RB-c depicted in FIGS. 8A and 8B, the configurations similar to those of the pixel 21RB-a depicted in FIGS. 6A and 6B are denoted by the same signs and the detail description thereof will be skipped. To be more specific, the pixel 21RB-c is similar in configuration to the pixel 21RB-a depicted in FIGS. 6A and 6B in the structure of surface radiation type.

It should be noted, however, that, with the pixel 21 RB-c, the PD 31B-1 and the PD 31B-2 are arranged as divided into the upper and lower sections of the diagram with the PD 31R-c being arranged as undivided, which provides a configuration different from the pixel 21RB-a depicted in FIGS. 6A and 6B. To be more specific, with the pixel 21RB-a depicted in FIGS. 6A and 6B, the PD 31R-1 and the PD 31R-2 for photoelectrically converting red light are used for phase difference detection, while, with the pixel 21RB-c, the PD 31B-1 and the PD 31B-2 for photoelectrically converting blue light are used for phase difference detection.

As described above, the comparison between the pixel 21RB-c and the pixel 21RB-a depicted in FIGS. 6A and 6B indicates that a configuration in which any one of the PD 31R and the PD 31B is arranged as divided so as to be able to use at least one of red light and blue light for phase difference detection may be employed.

Figures 9A, 9B:
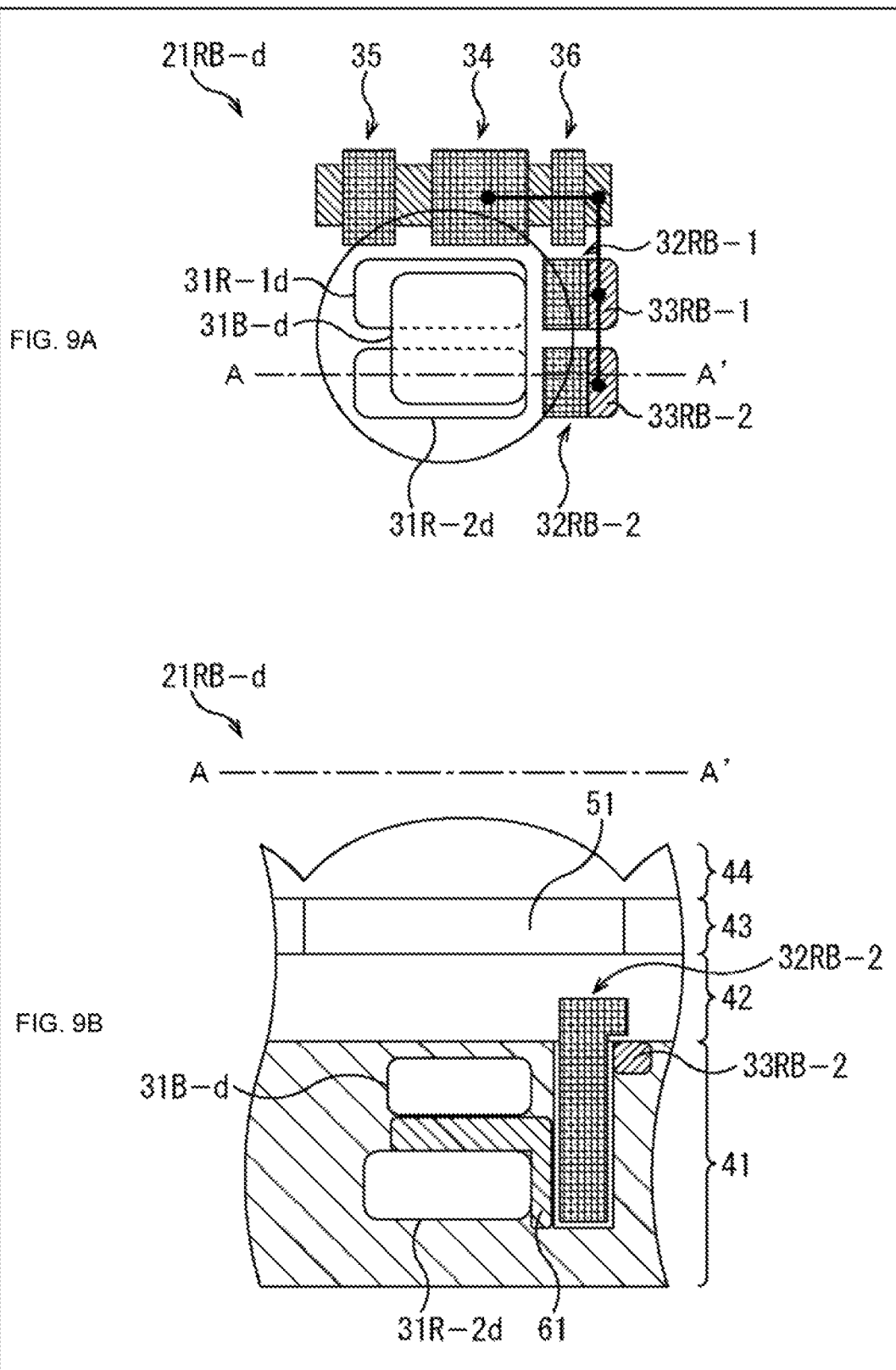
FIGS. 9A and 9B depict diagrams illustrating a fifth configurational example of a pixel capable of outputting read and blue pixel signals.

The following describes an example of a fifth configuration of the pixel 21RB with reference to FIGS. 9A and 9B. FIG. 9A depicts an example of a planar configuration of a pixel 21RB-d and FIG. 9B depicts an example of a cross-sectional configuration of the pixel 21RB-d along a one-dot dash line A-A' depicted in FIG. 9A.

With the pixel 21RB-d depicted in FIGS. 9A and 9B, the configurations similar to those of the pixel 21RB-a depicted in FIGS. 6A and 6B are denoted by the same signs and the detail description thereof will be skipped. To be more specific, the pixel 21RB-d is similar in configuration to the pixel 21RB-a depicted in FIGS. 6A and 6B in the structure of surface radiation type.

Further, with the pixel 21RB-d, a PD 31R-1$d$ and a PD 31R-2$d$ are arranged as divided into the upper and lower sections in the diagram, the PD 31B-d being arranged not divided. In addition, with the pixel 21RB-d, the reading of charges from the PD 31R-1$d$ and the PD 31R-2$d$ and the reading of charges from the PD 31B-d are executed by the common transfer transistors 32RB-1 and 32RB-2. Further, with the pixel 21RB-d, a high-concentration P-type domain 61 that is high in impurity concentration of P type is formed between the PD 31R-1$d$ and the PD 31R-2$d$ and the PD 31B-d and between the PD 31B-2 and the PD 31R-2$d$ and the transfer transistors 32RB-1 and 32RB-2.

The transfer transistors 32RB-1 and 32RB-2 are configured by vertical gate electrodes embedded to a depth approximately the same as the depth at which the PD 31R-1$d$ and the PD 31R-2$d$ are arranged. By switching between the voltages to be applied to the vertical gate electrodes, the reading of charges from the PD 31R-1$d$ and the PD 31R-2$d$ and the reading of charges from the PD 31B-d can be executed in a switching manner. For example, a read voltage threshold is set to the pixel 21RB-d by arranging the high-concentration P-type domain 61 such that charges accumulated in the PD 31B-d are first read by applying a low voltage and then a high voltage so as to read the voltages applied to the PD 31R-1$d$ and the PD 31R-2$d$.

The pixel 21RB-d configured as described above can be more reduced in area size than the pixel 21RB-a depicted in FIGS. 6A and 6B, for example, by use of the transfer transistors 32RB-1 and 32RB-2 in a shared manner.

The following describes an example of a configuration of a pixel 21RGB capable of outputting an R signal, a G signal, and B signal with reference to FIGS. 10A and 10B. FIG. 10A depicts an example of a planar configuration of the pixel 21RGB and FIG. 10B depicts an example of a cross-sectional configuration of the pixel 21RGB along one-dot dash line A-A' depicted in FIG. 10A.

With the pixel 21RGB depicted in FIGS. 10A and 10B, the configurations similar to those of the pixel 21RB-d depicted in FIGS. 9A and 9B are denoted by the same signs and the detail description thereof will be skipped. To be more specific, the pixel 21RBG is similar in configuration to the pixel 21RB-d depicted in FIGS. 9A and 9B in the configuration in which the transfer transistors 32RB-1 and 32RB-2 are used by the PD 31R-1 and the PD 31R-2 and the PD 31B-d in a shared manner.

It should be noted however that the pixel 21RGB is different in configuration from the pixel 21RB-d depicted in FIGS. 9A and 9B in that a green light photoelectrical conversion film 52 is laminated instead of the color filter 51 of magenta depicted in FIGS. 9A and 9B. To be more specific, the pixel 21RGB is configured such that the green light of the radiated light is photoelectrically converted in the green light photoelectrical conversion film 52 and the red and blue lights are put into the semiconductor substrate 41.

By the configuration as described above, one pixel 21RGB can photoelectrically convert red light in the PD 31R-1 and the PD 31R-2, photoelectrically convert green light in the green light photoelectrical conversion film 52, and photoelectrically convert blue light in the PD 31B-d. To be more specific, from one pixel 21RGB, an R signal, a G signal, and a B signal can be outputted and, at the same time, these signals can be independently read from the PD 31R-1 and the PD 31R-2 individually so as to be used for phase difference detection.

It should be noted that the image sensing device 11 is applicable to various types of electronic apparatuses such as image sensing systems including digital still cameras and digital video cameras, mobile phones having image sensing functions, and other devices having image sensing functions.

Figure 11:
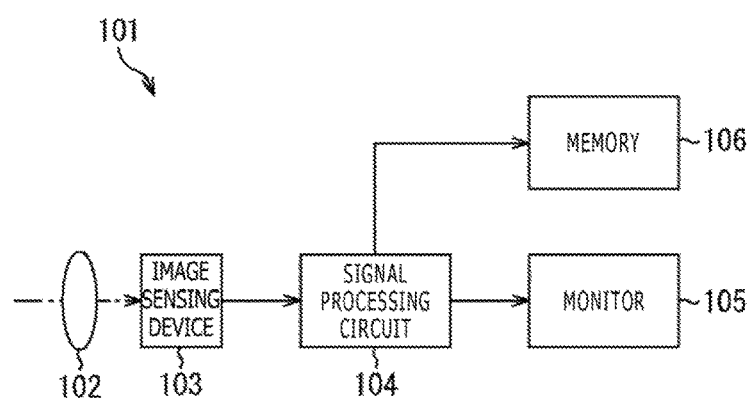
FIG. 11 is a block diagram illustrating a configurational example of one embodiment of an image sensing apparatus to which the present technology is applied.

Referring to FIG. 11, there is depicted a block diagram illustrating an example of a configuration of an image sensing apparatus mounted on an electronic apparatus.

As depicted in FIG. 11, an image sensing apparatus 101 has an optical system 102, an image sensing device 103, a signal processing circuit 104, a monitor 105, and a memory 106 and is capable of taking still images and moving images.

The optical system 102 has one or more lenses to guide an image light (an incident light) from a subject to the image sensing device 103, thereby forming an image on a photosensitive surface (a sensor section) of the image sensing device 103.

For the image sensing device 103, the image sensing device 11 described before is applied. The image sensing device 103 accumulates electrons for a certain period of time in accordance with an image formed on the photosensitive surface through the optical system 102. Then, a signal corresponding to the electrons accumulated in the image sensing device is supplied to the signal processing circuit 104.

The signal processing circuit 104 executes various kinds of signal processing on the pixel signal outputted from the image sensing device 103. An image (image data) obtained by the execution of signal processing by the signal processing circuit 104 is supplied to the monitor 105 to be displayed or supplied to the memory 106 to be stored (recorded).

With the image sensing apparatus 101 configured as described above, application of the image sensing device 11 as described above allows the enhancement of the focusing accuracy on a subject, thereby sensing an image that is surely in focus.

Figure 12:
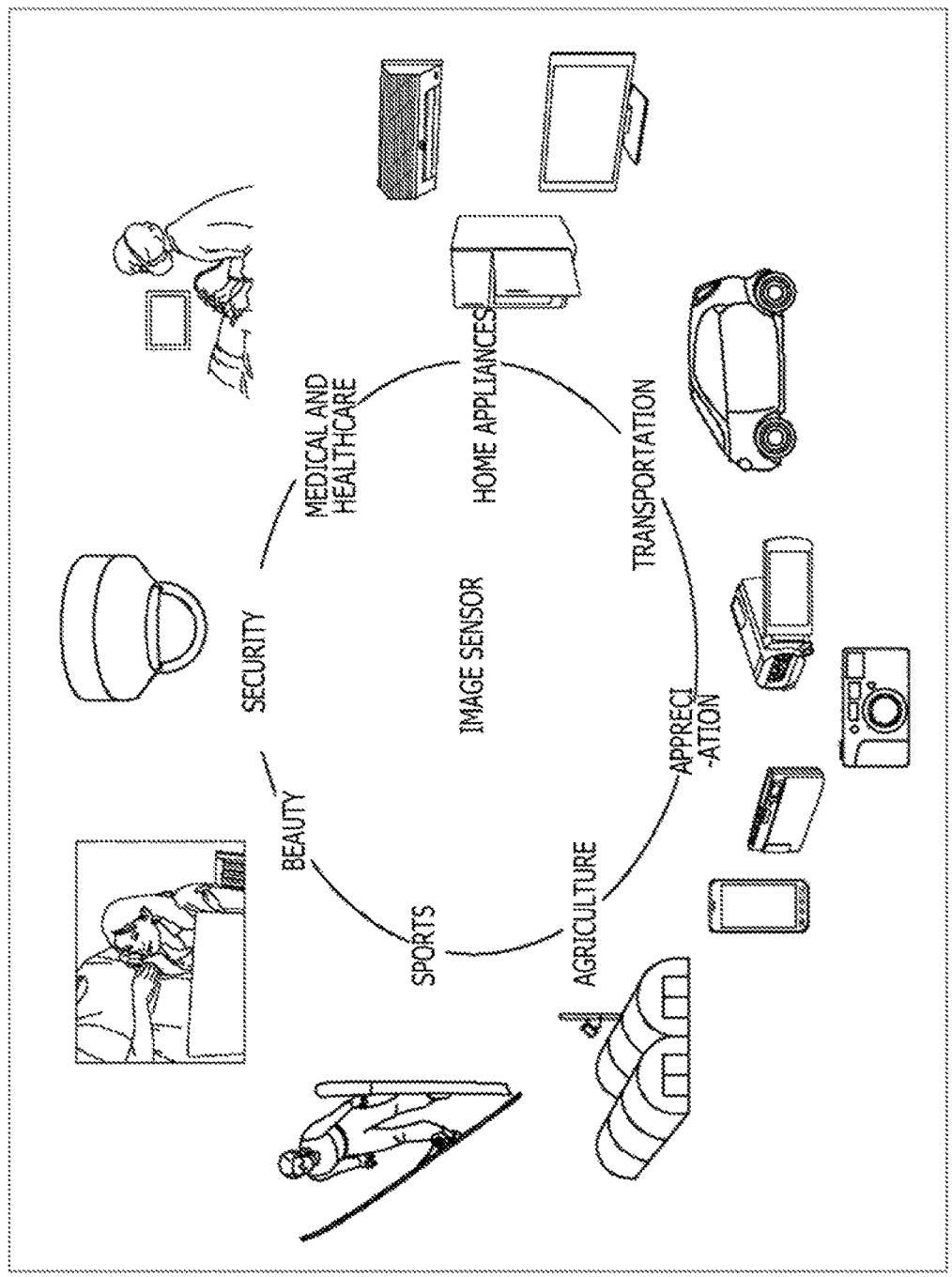
FIG. 12 is a diagram illustrating a use example of an image sensor.

Referring to FIG. 12, there is depicted a diagram illustrating an example of the use of the image sensor described above.

The image sensor described above is usable in various cases where lights including visible light, infrared light, ultraviolet light, and X-ray are sensed as described below.

Apparatuses for sensing images for use in appreciation such as digital cameras and mobile phones having cameras.

Apparatuses for use in transportation, such as car-mounted sensors for taking images of the front, rear, surrounding, and inside of vehicles for the safe operations including automatic stop and the recognition of driver's conditions, monitor cameras for monitoring travelling vehicles and roads, and distance measuring sensors for measuring distance between vehicles, and so on.

Apparatuses for use in household appliances such as television receivers (TVs), refrigerators, and air conditioners so as to take images of gestures done by users to accordingly execute control operations on these appliances.

Apparatuses for use in medical and healthcare, such as endoscope and devices for performing angiography by receiving light of infrared light.

Apparatuses for use in security, such as monitor cameras for theft prevention and cameras for personal authentication.

Apparatuses for use in beauty, such as skin diagnosis equipment for taking images of skin and microscopes for taking scalp images.

Apparatuses for use in sports, such as action cameras and wearable cameras for taking images of sports.

Apparatuses for use in agriculture, such as cameras for monitoring field and crop states.

It should be noted that the present technology can take the following configurations.

(1)

A solid-state image sensing device includes a plurality of pixels in which a first photoelectrical conversion section photoelectrically converting a visible light of a first wavelength range and a second photoelectrical conversion section photoelectrically converting a visible light of a second wavelength range are formed in different depths as viewed from a cross-sectional direction, and a drive section configured to execute a drive operation of reading each pixel signal having a level corresponding to charges generated in each of the first photoelectrical conversion section and the second photoelectrical conversion section from each of the plurality of pixels, wherein, in each of the plurality of pixels, at least one of the first photoelectrical conversion section and the second photoelectrical conversion section is configured as divided when viewed from a planar direction.

(2)

The solid-state image sensing device according to (1) above wherein, in the plurality of pixels, a conversion section converting a charge obtained by photoelectrical conversion by the first photoelectrical conversion section into a first pixel signal and a conversion section converting a charge obtained by photoelectrical conversion by the second photoelectrical conversion section into a second pixel signal are used in a shared manner, and the drive section executes a drive operation of simultaneously reading the first pixel signal and the second pixel signal from one of the plurality of pixels.

(3)

The solid-state image sensing device according to (1) above wherein, in one of the plurality of pixels, a conversion section converting a charge obtained by photoelectrical conversion by the first photoelectrical conversion section into a first pixel signal and a conversion section converting a charge obtained by photoelectrical conversion by the second photoelectrical conversion section into a second pixel signal are used in a shared manner, and the drive section executes a drive operation of sequentially reading the first pixel signal and the second pixel signal from the one pixel.

(4)

The solid-state image sensing device according to any one of (1) to (3) above wherein both the first photoelectrical conversion section and the second photoelectrical conversion section are configured as divided into difference directions when viewed in a planar manner.

(5)

The solid-state image sensing device according to (4) above wherein the first photoelectrical conversion section executes photoelectrical conversion of a light of a red wavelength range and the second photoelectrical conversion section executes photoelectrical conversion of a light of a blue wavelength range and the first photoelectrical conversion section and the second photoelectrical conversion section are divided into directions that are approximately orthogonal with each other when viewed in a planar manner.

(6) The solid-state image sensing device according to any one of (1) to (5) above wherein a transfer transistor is used in a shared manner by transfer of charges from the first photoelectrical conversion section and transfer of charges from the second photoelectrical conversion section, and in accordance with a voltage to be applied to a vertical gate electrode of the transfer transistor, the transfer of charges from the first photoelectrical conversion section and the transfer of charges from the second photoelectrical conversion section are switched between.

(7) The solid-state image sensing device according to any one of (1) to (6) above wherein the solid-state sensing device has a structure in which a light is radiated onto a rear surface opposite to a surface on which a wiring layer is laminated on a semiconductor substrate formed with the first photoelectrical conversion section and the second photoelectrical conversion section.

(8) The solid-state image sensing device according to any one of (1) to (7) above wherein a photoelectrical conversion film photoelectrically converting a visible light of a third wavelength range is laminated on a photosensitive surface side of a semiconductor substrate formed with the first photoelectrical conversion section and the second photoelectrical conversion section.

(9) A method of driving a solid-state image sensing device, the solid-state image sensing device includes a plurality of pixels in which a first photoelectrical conversion section photoelectrically converting a visible light of a first wavelength range and a second photoelectrical conversion section photoelectrically converting a visible light of a second wavelength range are formed in different depths as viewed from a cross-sectional direction, and a drive section configured to execute a drive operation of reading each pixel signal having a level corresponding to charges generated in each of the first photoelectrical conversion section and the second photoelectrical conversion section from each of the plurality of pixels, wherein, in each of the plurality of pixels, at least one of the first photoelectrical conversion section and the second photoelectrical conversion section is configured as divided when viewed from a planar direction, in the plurality of pixels, a conversion section converting a charge obtained by photoelectrical conversion by the first photoelectrical conversion section into a first pixel signal and a conversion section converting a charge obtained by photoelectrical conversion by the second photoelectrical conversion section into a second pixel signal are used in a shared manner, and the drive section executes a drive operation of simultaneously reading the first pixel signal and the second pixel signal from one of the plurality of pixels.

(10) An electronic apparatus having a solid-state image sensing device, the solid-state image sensing device includes a plurality of pixels in which a first photoelectrical conversion section photoelectrically converting a visible light of a first wavelength range and a second photoelectrical conversion section photoelectrically converting a visible light of a second wavelength range are formed in different depths as viewed from a cross-sectional direction, and a drive section configured to execute a drive operation of reading each pixel signal having a level corresponding to charges generated in each of the first photoelectrical conversion section and the second photoelectrical conversion section from each of the plurality of pixels, wherein, in each of the plurality of pixels, at least one of the first photoelectrical conversion section and the second photoelectrical conversion section is configured as divided when viewed from a planar direction.

While preferred embodiments of the present disclosure have been described using specific terms, such description is for illustrative purpose only, and it is to be understood by those skilled in the art that changes and variations may be made without departing from the spirit or scope of the present disclosure.

REFERENCE SIGNS LIST

11 Image sensing device, 12 Pixel area, 13 Vertical drive circuit, 14 Column signal processing circuit, 15 Horizontal drive circuit, 16 Output circuit, 17 Control circuit, 21 Pixel, 31 PD, 32 Transfer transistor, 33 FD section, 34 Amplification transistor, 35 Selection transistor, 36 Reset transistor, 41 Semiconductor substrate, 42 Wiring layer, 43 Filter layer, 44 On-chip Lens layer, 45 Insulation layer, 51 Color filter, 52 Green light photoelectrical conversion film

The invention claimed is:

1. A solid-state image sensing device, comprising:
   a pixel area with a plurality of pixels in which a first photoelectrical conversion section photoelectrically converts first visible light of a first wavelength range, and a second photoelectrical conversion section photoelectrically converts second visible light of a second wavelength range, wherein said first photoelectrical conversion section and said second photoelectrical conversion section are at different depths as viewed from a cross-sectional direction of said pixel area; and
   a drive section configured to execute a first drive operation to read each pixel signal, from each of said plurality of pixels, having a potential corresponding to charges generated in each of said first photoelectrical conversion section and said second photoelectrical conversion section,
   wherein, in each of said plurality of pixels, both said first photoelectrical conversion section and said second photoelectrical conversion section are configured as divided into directions that are approximately orthogonal with each other when viewed from a planar direction of said pixel area.

2. The solid-state image sensing device according to claim 1, wherein, in one of said plurality of pixels, a first conversion section that converts a first charge, obtained by photoelectrical conversion by said first photoelectrical conversion section, into a first pixel signal and a second conversion section that converts a second charge, obtained by photoelectrical conversion by said second photoelectrical conversion section, into a second pixel signal are used in a shared manner, and
   said drive section executes a second drive operation that simultaneously reads said first pixel signal and said second pixel signal from said one of said plurality of pixels.

3. The solid-state image sensing device according to claim 2, further comprising:
   a first transfer transistor is configured to transfer said first charge from said first photoelectrical conversion section to first conversion section; and
   a second transfer transistor is configured to transfer said second charge from said second photoelectrical conversion section to said second conversion section, wherein said first transfer transistor and said second transfer transistor are used in a shared manner, and wherein said transfer of charges from said first photoelectrical conversion section and said transfer of charges from said second photoelectrical conversion section are switched based on a switch of a first voltage applied to a first vertical gate electrode of said first transfer transistor with a second voltage applied to a second vertical gate electrode of said second transfer transistor.

4. The solid-state image sensing device according to claim 1, wherein, in one of said plurality of pixels, a first conversion section that converts a first charge, obtained by photoelectrical conversion by said first photoelectrical conversion section, into a first pixel signal and a second conversion section that converts a second charge, obtained by photoelectrical conversion by said second photoelectrical conversion section, into a second pixel signal are used in a shared manner, and said drive section executes a third drive operation that sequentially reads said first pixel signal and said second pixel signal from said one of said plurality of pixels.

5. The solid-state image sensing device according to claim 1, wherein said first wavelength range is in a red wavelength range and said second wavelength range is in a blue wavelength range.

6. The solid-state image sensing device according to claim 1, has further comprising a structure in which a light is radiated onto a rear surface opposite to a photosensitive surface on which a wiring layer is laminated, on a semiconductor substrate with said first photoelectrical conversion section and said second photoelectrical conversion section.

7. The solid-state image sensing device according to claim 6, wherein a photoelectrical conversion film configured to photoelectrically convert visible light of a third wavelength range is laminated on a side of said photosensitive surface of said semiconductor substrate with said first photoelectrical conversion section and said second photoelectrical conversion section.

8. A method of driving a solid-state image sensing device, comprising:
wherein said solid-state image sensing device comprises a drive section and a pixel area with a plurality of pixels in which a first photoelectrical conversion section and a second photoelectrical conversion section are at different depths as viewed from a cross-sectional direction of said pixel area, photoelectrically converting, by the first photoelectrical conversion section, first visible light of a first wavelength range;

photoelectrically converting, by the second photoelectrical conversion section, second visible light of a second wavelength range;

executing a first drive operation on the drive section for reading each pixel signal, from each of said plurality of pixels, having a potential corresponding to charges generated in each of said first photoelectrical conversion section and said second photoelectrical conversion section, wherein:

in each of said plurality of pixels, both said first photoelectrical conversion section and said second photoelectrical conversion section are configured as divided into directions that are approximately orthogonal with each other when viewed from a planar direction of said pixel area, and in one of said plurality of pixels, a first conversion section converting a first charge obtained by photoelectrical conversion by said first photoelectrical conversion section into a first pixel signal and a second conversion section converting a second charge obtained by photoelectrical conversion by said second photoelectrical conversion section into a second pixel signal are used in a shared manner; and executing a second drive operation on said drive section for simultaneously reading said first pixel signal and said second pixel signal from said one of said plurality of pixels.

9. An electronic apparatus having a solid-state image sensing device, said solid-state image sensing device, comprising:

a pixel area with a plurality of pixels in which a first photoelectrical conversion section photoelectrically converts first visible light of a first wavelength range, and a second photoelectrical conversion section photoelectrically converts second visible light of a second wavelength range, wherein said first photoelectrical conversion section and said second photoelectrical conversion section are at different depths as viewed from a cross-sectional direction of said pixel area; and a drive section configured to execute a first drive operation to read each pixel signal, from each of said plurality of pixels, having a potential corresponding to charges generated in each of said first photoelectrical conversion section and said second photoelectrical conversion section, wherein, in each of said plurality of pixels, both said first photoelectrical conversion section and said second photoelectrical conversion section are configured as divided into directions that are approximately orthogonal with each other when viewed from a planar direction of said pixel area.

* * * * *